United States Patent

Hamamoto et al.

Patent Number: 6,117,753
Date of Patent: Sep. 12, 2000

[54] METHOD OF MANUFACTURING COMPOUND SEMICONDUCTOR INTEGRATED CIRCUIT

[75] Inventors: Kiichi Hamamoto; Takashi Matsumoto, both of Tokyo, Japan

[73] Assignee: NEC Corporation, Tokyo, Japan

[21] Appl. No.: 08/565,984

[22] Filed: Dec. 1, 1995

[30] Foreign Application Priority Data

Dec. 15, 1994 [JP] Japan .................................. 6-332813

[51] Int. Cl.$^7$ ................................................. H01L 21/36
[52] U.S. Cl. ............................................................ 438/503
[58] Field of Search .................................... 438/503, 504, 438/505, 507, 508; 385/14

[56] References Cited

PUBLICATIONS

Copy of the Official Communication.
Iga, et al., Applied physics Letters 64 Feb. 21, 1994, Lateral band–gap control of InGaAsP multiple quantam wells by laser–assisted metalorganic molecular beam epitaxy for a multiwavelength laser array, pp. 983–985.
Sasaki, et al., Electronics and Communcations in Japan Part II: Electronics 76 Apr. 1993, No. 4, Selective MOVPE Growth and Its Application to Semiconductor Photonic Integrated Circuits, pp. 1–11.
S.K. Ghandi, VLSI Fabrication Principles: Silicon and Gallium Arsenide, Chapter 8 (no month available), 1994.
Kirihara et al, OQD–90–61 printed by The Institute of Electrical Engineers of Japan (1993) K.C.
Kato et al., Electronics Letters vol. 28 (1992), p. 153.

*Primary Examiner*—Charles Bowers
*Assistant Examiner*—Keith Christianson
*Attorney, Agent, or Firm*—Laff, Whitesel & Saret, Ltd.; J. Warren Whitesel

[57] ABSTRACT

A method of manufacturing a compound semiconductor integrated circuit having a portion at which compound semiconductor layers having different compositions from each other are continuously formed on a semiconductor substrate in a lateral direction includes the following steps. A substrate surface subjected to epitaxial growth is kept at partially different temperatures. Selective epitaxial growth is performed by vapor phase growth in this state to form the compound semiconductor layers having different compositions from each other. The surface structures forming the integrated circuit are created by lithography for localizing heating or cooling during growth of epitaxial layers.

7 Claims, 7 Drawing Sheets

METHOD OF MANUFACTURING COMPOUND SEMICONDUCTOR INTEGRATED CIRCUIT

BACKGROUND OF THE INVENTION

1. Field of the Invention

The present invention relates to a method of manufacturing a compound semiconductor integrated circuit and, more particularly, to a method of manufacturing a compound semiconductor integrated circuit obtained by continuously forming semiconductor layers having different compositions (i.e., different bandgaps) in the lateral direction.

2. Description of the Prior Art

Optical semiconductor integrated circuits on which functional elements such as semiconductor lasers, semiconductor light-receiving elements, and semiconductor modulators are integrated on a single substrate have been intensively studied and developed. This is because individual functional elements need not be connected to each other through passive waveguides such as optical fibers owing to integration to realize compactness, and the step of connecting passive waveguides and the like can be simplified to effectively reduce the cost.

As a conventional example of such optical integrated circuits, there is an optical switch with an integrated optical amplifier (Kirihara et al., OQD-90-61 printed by The Institute of Electrical Engineers of Japan) see also the tenth reference cited therein, which is T. Kirihara et al, in proc. top. meet. photonic switching 1993, pp. 25–28. In this report, the wavelength composition (wavelength corresponding to the forbidden width of a semiconductor material having a certain composition) of the material of an optical waveguide serving as an passive element is set to be shorter than that of an optical amplifier serving as an active element, thereby reducing an absorption loss. In this conventional example, however, to obtain different wavelength compositions of the passive waveguide and the optical amplifier, semiconductors having compositions corresponding to the respective wavelengths are formed in individual crystal growth steps, and crystals having different wavelength compositions are integrated on a single substrate.

The crystal growth step, therefore, must be repeated at least the same number of times as the number of functional elements having different wavelength compositions. The manufacturing yield of a device is degraded to undesirably increase the manufacturing cost, as compared with a case in which respective functional elements are independently formed.

As a conventional example to improve the above problem, there is an example to be described below (Kato et al., Electronics Letters Vol. 28 (1992), pp. 153). In this report, an $SiO_2$ stripe mask is formed on an InP substrate in advance. InGaAsP is selectively, epitaxially grown in a non-masked region by metal organic vapor phase epitaxy (MOVPE) to integrate a distributed feedback laser (DFB-LD) and an electroabsorption optical modulator (EA-MOD).

This conventional example utilizes the principle that, as the stripe width of a selective MOVPE crystal growth mask increases, an In content in a non-masked region increases. The wavelength composition of InGaAsP is changed by changing the ratio of Group III elements (In and Ga in this example) in selectively grown crystals.

The above conventional example in which semiconductor layers having different wavelength compositions are epitaxially grown depending on the mask stripe width has the following problem because the composition difference is attained by changing the ratio of Group III elements.

A dashed line in the graph of FIG. 1 indicates the relationship between a wavelength composition change $\Delta\lambda$ (nm) and a lattice strain $\Delta a/a$ (%) when the ratio of Group III elements is changed at a constant ratio of Group V elements in a semiconductor layer formed by the above technique. In general, when a light-emitting element and a passive wave-guide are to be integrated, the wavelength composition of the passive waveguide must be shorter than that of the light-emitting element to avoid the absorption loss of light in the passive waveguide. As is indicated by the dashed line in FIG. 1, however, when the wavelength composition is changed by 100 nm or more by the conventional method, the lattice strain becomes 0.5% or more. Due to an excess lattice strain, a high-quality crystal cannot be obtained.

SUMMARY OF THE INVENTION

The present invention has been made in consideration of the above problems in the prior art, and has as the first object to grow semiconductor layers having different wavelength compositions with single step epitaxial growth to improve the manufacturing yield and decrease the manufacturing cost. It is the second object to form semiconductor layers having different wavelength compositions with a smaller lattice strain.

To achieve the above objects, according to the basic aspect of the present invention, there is provided a method of manufacturing a compound semiconductor integrated circuit including a portion at which compound semiconductor layers having different compositions from each other are continuously formed on a semiconductor substrate in a lateral direction, comprising the steps of keeping a substrate surface subjected to epitaxial growth at partially different temperatures, and performing selective epitaxial growth by vapor phase growth in the state.

The substrate surface is set to partially different temperatures as follows. Metal films, electromagnetic wave absorbers, or electromagnetic wave reflectors are formed adjacent to at least part of the substrate surface subjected to selective epitaxial growth. More specifically, the substrate surface is set to partially different temperatures as follows. Striped masks having the metal films formed partially, striped masks consisting of the electromagnetic wave absorbers with partially high electromagnetic wave absorbing abilities, or striped masks consisting of the electromagnetic wave reflectors with partially high electromagnetic wave reflecting abilities are formed on both sides of a region subjected to selective epitaxial growth so as to sandwich the region.

In the present invention, portions having different substrate temperatures are formed on the surface of the semiconductor substrate subjected to selective epitaxial growth. In this state, epitaxial growth is performed by vapor phase growth. FIG. 2 is a graph showing the relationship between the wavelength composition of InGaAsP and a growth temperature. As is seen from FIG. 2, when the growth temperature increases while the partial pressure of $PH_3$ in the vapor phase is kept unchanged, decomposition of $PH_3$ is promoted to increase the P concentration in the crystal. As a result, the wavelength composition of a semiconductor layer which grows in a high-temperature region becomes shorter than that in the remaining region.

A solid line in the graph of FIG. 1 indicates the relationship between a wavelength composition change $\Delta\lambda$ (nm) and a lattice strain Δa/a (%) when the ratio of Group V elements (As and P in this example) in the InGaAsP crystal is changed at a constant ratio of Group III elements in the InGaAsP crystal. As is apparent from FIG. 1, even if the ratio of Group V elements is changed, the same wavelength composition change can be obtained as in the case indicated by the dashed line in FIG. 1 wherein the ratio of Group III elements is changed. In addition, when the ratio of Group V elements is changed, the lattice strain is as small as about 0.3% even with a wavelength composition change of 150 nm.

According to the present invention, crystal growth is performed in the state wherein a semiconductor region subjected to selective epitaxial growth has a temperature difference. Semiconductor layers having different wavelength compositions can be realized with a smaller lattice strain. According to the present invention, therefore, a semiconductor integrated circuit such as an optical integrated circuit can be formed of high-quality epitaxial growth layers, and a high-quality device can be provided at a high yield.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF PREFERRED EMBODIMENTS

Preferred embodiments of the present invention will be described in detail below with reference to the accompanying drawings.

First Embodiment

FIGS. 3A to 3F are perspective views sequentially showing the manufacturing steps of the first embodiment of the present invention. Note that this embodiment is related to a method of manufacturing an integrated optical guiding layer.

Figure 3A:
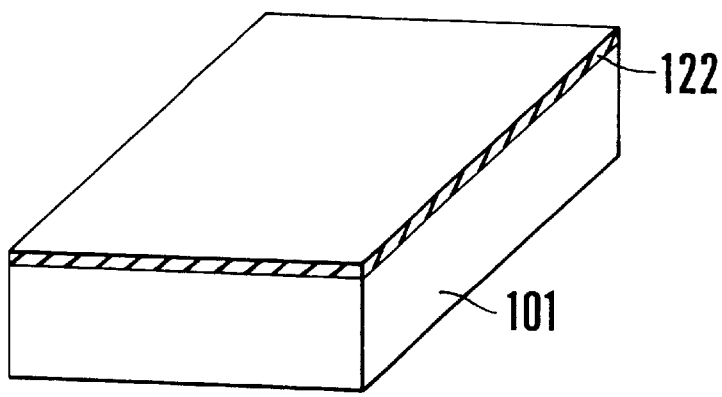
FIGS. 3A to 3F are perspective views sequentially showing steps to explain the first embodiment of the present invention.

First of all, as shown in FIG. 3A, a first $SiO_2$ film 122 is deposited to a film thickness of about 1,000 Å on an n-InP substrate 101 by thermal CVD.

Figure 3B:
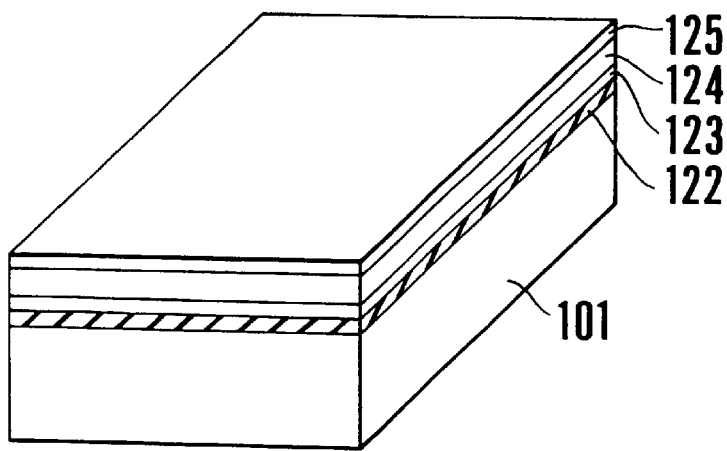

As shown in FIG. 3B, a first Ti film 123, an Au film 124, and a second Ti film 125 are sequentially stacked by sputtering. The thickness of the first Ti film 123 is about 500 Å, that of the Au film 124 is about 4,000 Å, and that of the second Ti film 125 is about 500 Å.

Figure 3C:
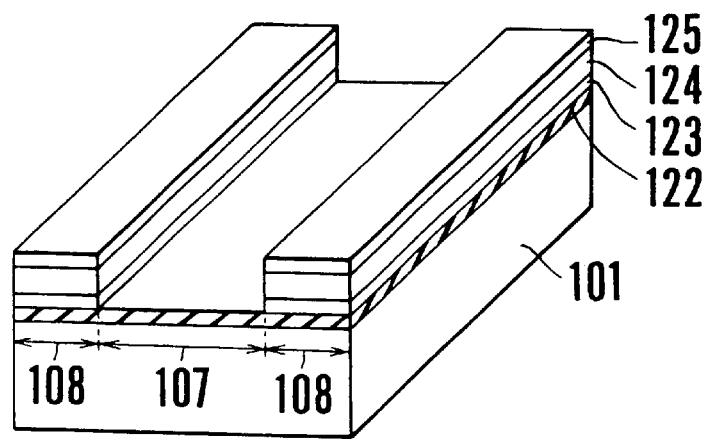

The second Ti film 125, the Au film 124, and the first Ti film 123 in an active guiding region 107 where an active guiding layer is to be formed are removed by conventional photolithography and wet etching. These metal films remain in only each passive guiding region 108 where a passive guiding layer is to be formed (FIG. 3C).

Figure 3D:
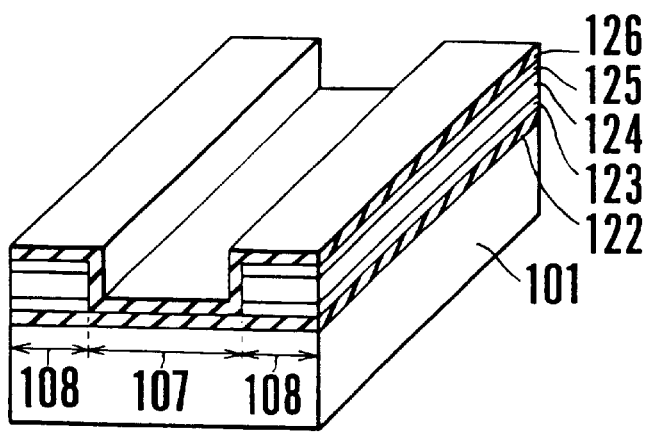
Figure 3E:
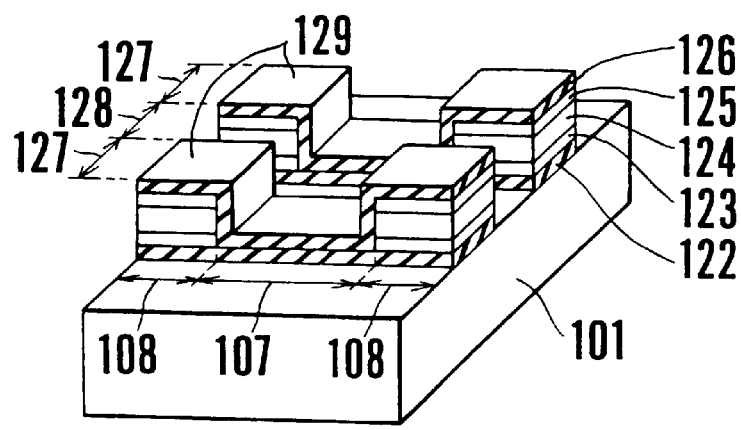

A second $SiO_2$ film 126 is deposited to a film thickness of about 1,000 Å on the entire surface by thermal CVD again (FIG. 3D). Thereafter, the second $SiO_2$ film 126, the second Ti film 125, the Au film 124, the first Ti film 123, and the first $SiO_2$ film 122 are selectively removed by conventional photolithography and wet etching to form a pair of striped masks 129 for selective MOVPE growth, as shown in FIG. 3E. A stripe width 127 is 20 μm, and the width of a gap portion 128 for selective growth is 1.5 μm.

Then, an n-InP buffer layer 131, an i-InGaAsP guiding layer 132, and a p-InP cladding layer 133 are sequentially stacked by selective MOVPE crystal growth, and the pair of striped masks 129 are removed.

In the MOVPE crystal growth, triethylgallium and trimethylindium are used as organometallic materials, and $AsH_3$ and $PH_3$ are used as Group V gases. $H_2$ is used as a carrier gas, and the growth pressure is set at about 1/10 atmospheric pressure.

The substrate is placed on a carbon susceptor and RF-heated to have a growth substrate temperature of about 600° C. At this time, the substrate temperature is partially increased by radiant heat upon substrate heating because the structure at the gap portion 128 in the passive guiding region 108 is sandwiched between the masks each including the first Ti film 123, the Au film 124, and the second Ti film 125. For this reason, decomposition of $PH_3$ is partially promoted in the passive guiding region 108 to increase the P concentration in the InGaAsP crystal.

Figure 3F:
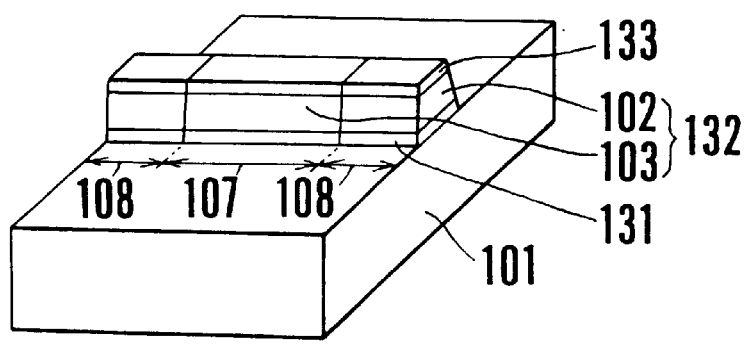

The i-InGaAsP guiding layer 132, therefore, is converted into a 1.15-μmn composition i-InGaAsP passive guiding layer 102 in the passive guiding region 108, and into a 1.3-μm composition i-InGaAsP active guiding layer 103 in the active guiding region 107 (FIG. 3F).

More specifically, according to the first embodiment, an optical guiding layer formed by continuously integrating the 1.15-μm composition i-InGaAsP passive guiding layer 102 and the 1.3-μm composition i-InGaAsP active guiding layer 103 in the optical waveguide direction can be obtained.

Figure 1:
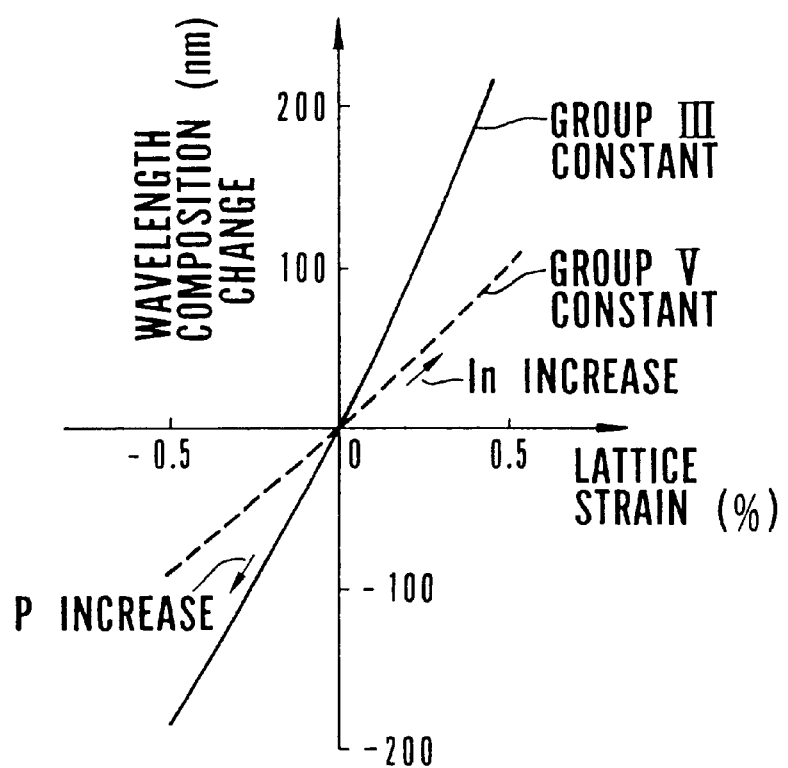
FIG. 1 is a graph showing the lattice strain as the wavelength composition changes, which presents a problem in the prior art and the function of the present invention.
Figure 2:
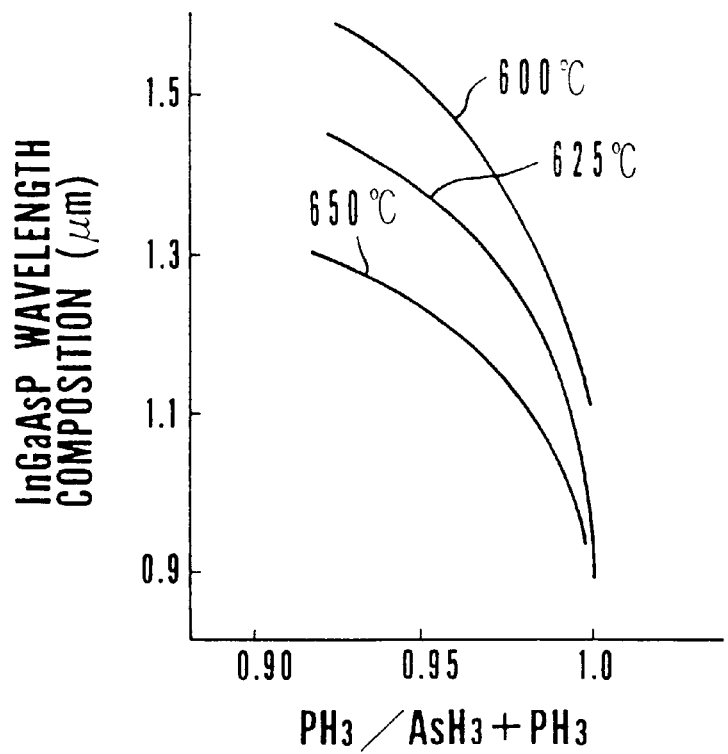
FIG. 2 is a graph for explaining the function of how the wavelength composition the present invention.

In the first embodiment, the wavelength composition of the active guiding region 107 is different from that of the passive guiding region 108 by 150 nm. The wavelength composition is changed by changing an As-P ratio in the crystal. With reference to FIG. 1, as indicated by the solid line, a lattice strain induced in the epitaxially grown crystal to obtain this difference between wavelength compositions is as small as about 0.3%. Therefore, an epitaxial layer almost free from defects can be obtained and manufactured at a high yield.

Second Embodiment

Next, the second embodiment of the present invention will be described. This embodiment is also related to a method of manufacturing an integrated optical guiding layer. FIGS. 4A to 4D are perspective views sequentially showing the manufacturing steps of the second embodiment.

Figure 4A:
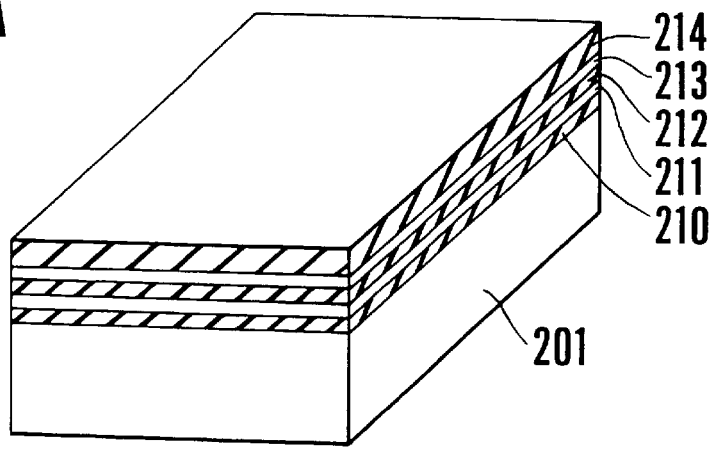
FIGS. 4A to 4D are perspective views sequentially showing steps to explain the second embodiment of the present invention.

First of all, as shown in FIG. 4A, a semi-reflecting film consisting of a first λ/4 $SiO_2$ film 210, a second λ/4 $Al_2O_3$ film 211, a third λ/4 $SiO_2$ film 212, a fourth λ/4 $Al_2O_3$ film 213, and a λ/2 $SiO_2$ film 214 is deposited on an n-InP substrate 201 by sputtering.

Figure 4B:
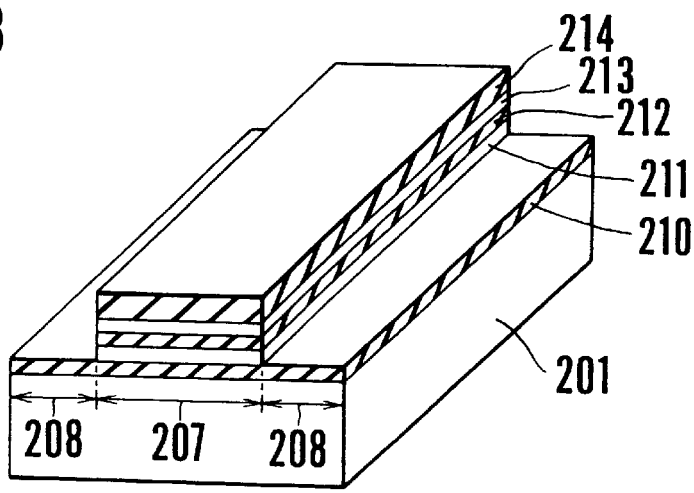

The thickness of the first $\lambda/4$ SiO$_2$ film 210 is about 840 Å, that of the second $\lambda/4$ Al$_2$O$_3$ film 211 is about 370 Å, that of the third $\lambda/4$ SiO$_2$ film 212 is about 840 Å, that of the fourth $\lambda/4$ Al$_2$O$_3$ film 213 is about 370 Å, and that of the $\lambda/2$ SiO$_2$ film 214 is about 1,670 Å. Thereafter, as shown in FIG. 4B, the $\lambda/2$ SiO$_2$ film 214, the fourth $\lambda/4$ Al$_2$O$_3$ film 213, the third $\lambda/4$ SiO$_2$ film 212, and the second $\lambda/4$ Al$_2$O$_3$ film 211 in each passive guiding region 208 are removed by conventional photolithography and wet etching.

Figure 4C:
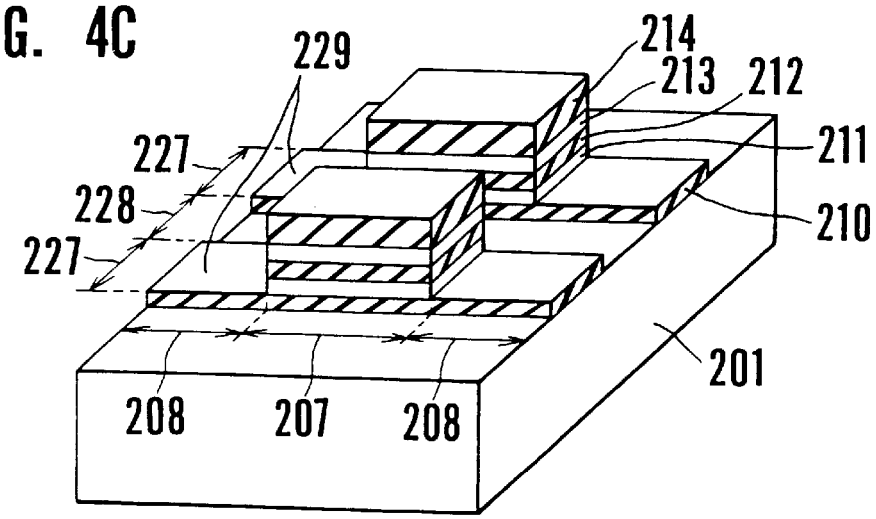

Subsequently, the $\lambda/2$ SiO$_2$ film 214, the fourth $\lambda/4$ Al$_2$O$_3$ film 213, the third $\lambda/4$ SiO$_2$ film 212, the second $\lambda/4$ Al$_2$O$_3$ film 211, and the first $\lambda/4$ SiO$_2$ film 210 are selectively removed by again using conventional photolithography and wet etching to form a pair of striped masks 229 for selective MOVPE crystal growth, as shown in FIG. 4C. A stripe width 227 is 20 μm, and the width of a gap portion 228 for selective epitaxial growth is 1.5 μm.

Then, an n-InP buffer layer 231, an i-InGaAsP guiding layer 232, and a p-InP cladding layer 233 are sequentially stacked by selective MOVPE crystal growth, and the pair of striped masks 229 are removed.

In the MOVPE crystal growth, triethylgallium and trimethylindium are used as organometallic materials, and AsH$_3$ and PH$_3$ are used as Group V gases. H2 is used as a carrier gas, and the growth pressure is set at about 1/10 atmospheric pressure. The substrate is placed on a carbon susceptor and RF-heated to have a growth substrate temperature of about 600° C.

During this growth, an Ar laser beam (wavelength: 488 nm) is irradiated on the entire surface of the wafer. At this time, the pair of striped masks 229 for selective MOVPE crystal growth serve as reflection preventing films each having a reflectance of 5% or less for the passive guiding region 208, and as semi-reflecting films each having a reflectance of 95% or more for an active guiding region 207.

In the passive guiding region 208, the n-InP substrate absorbs the Ar leaser beam to partially increase the substrate temperature upon this absorption.

Figure 4D:
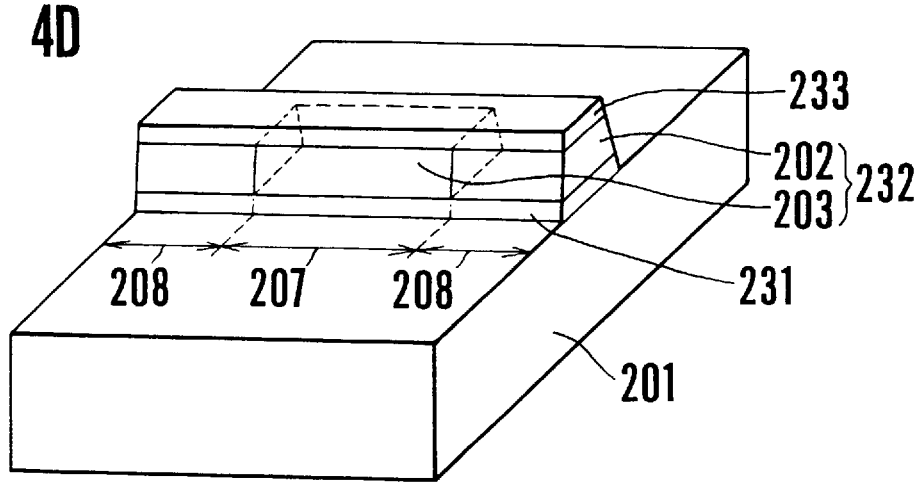

For this reason, decomposition of PH$_3$ is partially promoted in the passive guiding region 208 to increase the P concentration in the InGaAsP crystal. The i-InGaAsP guiding layer 232, therefore, is converted into a 1.15-μm composition i-InGaAsP passive guiding layer 202 in the passive guiding region 208, and into a 1.3-μm composition i-InGaAsP active guiding layer 203 in the active guiding region 207 (FIG. 4D).

Third Embodiment

Next, the third embodiment of the present invention will be described. This embodiment is also related to a method of manufacturing an integrated optical guiding layer. FIGS. 5A to 5D are perspective views sequentially showing the manufacturing steps of the third embodiment of the present invention.

Figure 5A:
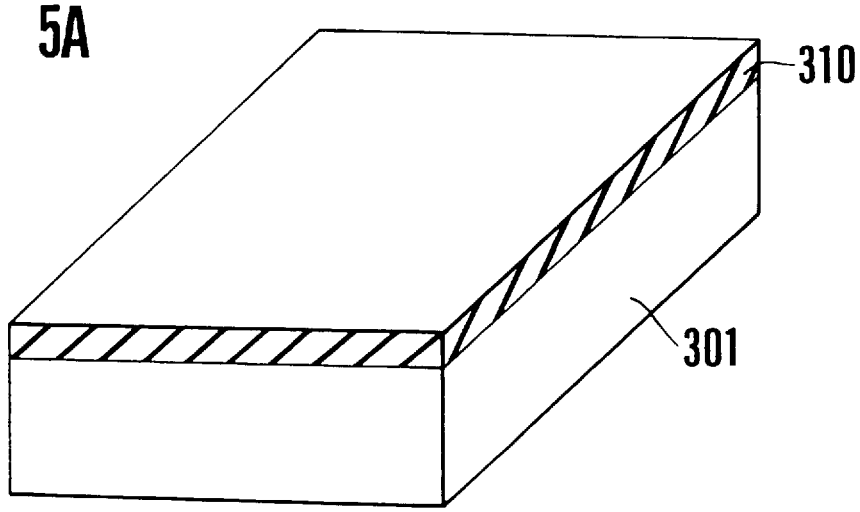
FIGS. 5A to 5D are perspective views sequentially showing steps to explain the third embodiment of the present invention.
Figure 5B:
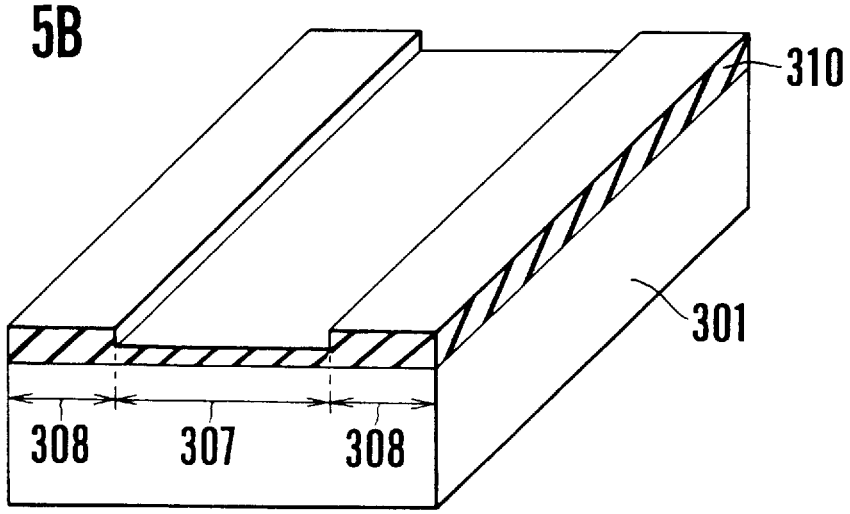

First of all, as shown in FIG. 5A, a $\lambda/4$ SiO$_2$ film 310 is deposited to a film thickness of about 840 Å on an n-InP substrate 301 by thermal CVD. As shown in FIG. 5B, the $\lambda/4$ SiO$_2$ film 310 in an active guiding region 307 is removed by about 400 Å by conventional photolithography and wet etching.

Figure 5C:
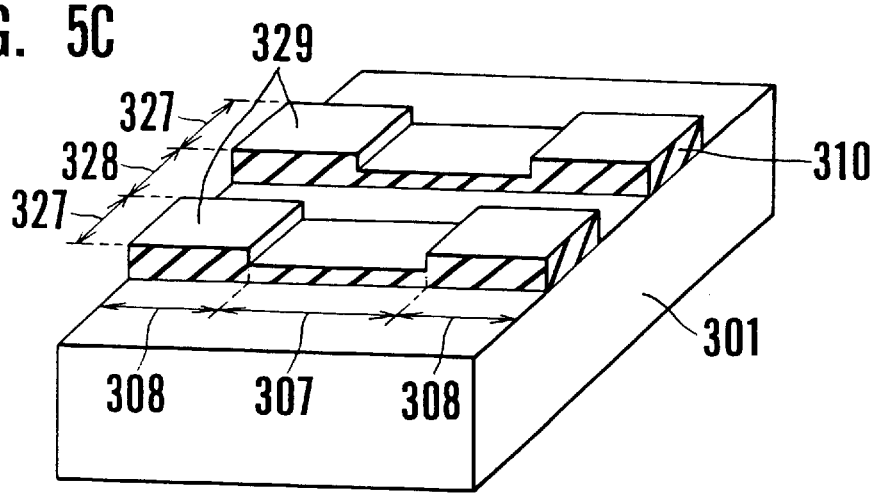

Thereafter, the $\lambda/4$ SiO$_2$ film 310 is selectively removed by again employing conventional photolithography and wet etching to form a pair of striped masks 329 for selective MOVPE crystal growth, as shown in FIG. 5C. A mask stripe width 327 is 30 μm, and the width of a gap portion 328 is 1.5 μm.

Then, an n-InP buffer layer 331, an i-InGaAsP guiding layer 332, and a p-InP cladding layer 333 are sequentially stacked by selective MOVPE crystal growth, and the pair of striped masks 329 are removed.

The growth conditions of this selective MOVPE crystal growth are the same as in the second embodiment.

During this growth, an Ar leaser beam (wavelength: 488 nm) is irradiated on the entire surface of the wafer. The selective MOVPE mask in each passive guiding region 308 consists of a reflection preventing film having a reflectance of 5% or less, so that the Ar laser beams are absorbed in the n-InP substrate in the passive guiding region 308. The selective MOVPE mask in the active guiding region 307 consists of a semi-reflecting film having a reflectance of about 30%, so that the Ar laser beam is not much absorbed in the n-InP substrate in the active guiding region 307.

Figure 5D:
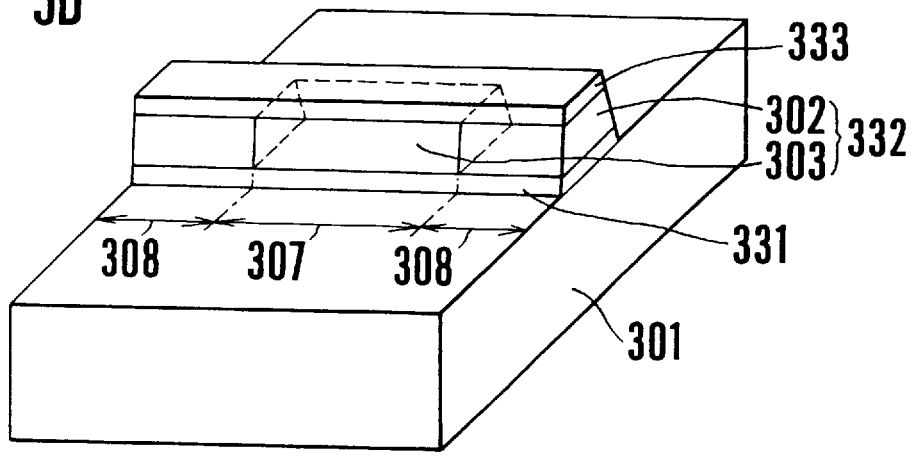

The temperature at the gap portion 328 in the passive guiding region 308 is partially increased. For this reason, decomposition of PH$_3$ is partially promoted in the passive guiding region 308 to increase the P concentration in the InGaAsP crystal. The i-InGaAsP guiding layer 332, therefore, is converted into a 1.15-μm composition InGaAsP passive guiding layer 302 for the passive guiding region 308, and into a 1.3-μm composition InGaAsP active guiding layer 303 for the active guiding region 307 (FIG. 5D).

Fourth Embodiment

Figure 7:
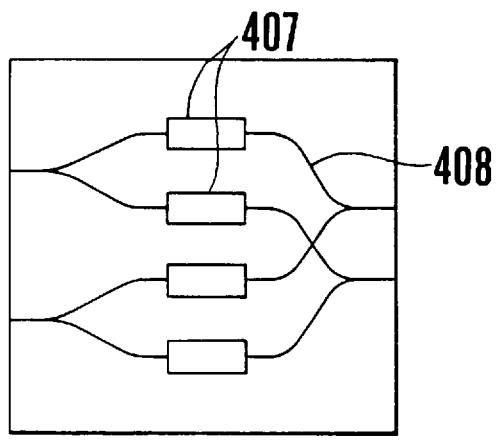
FIG. 7 is a plan view showing an optical integrated circuit manufactured in the fourth embodiment of the present invention.
Figure 6A:
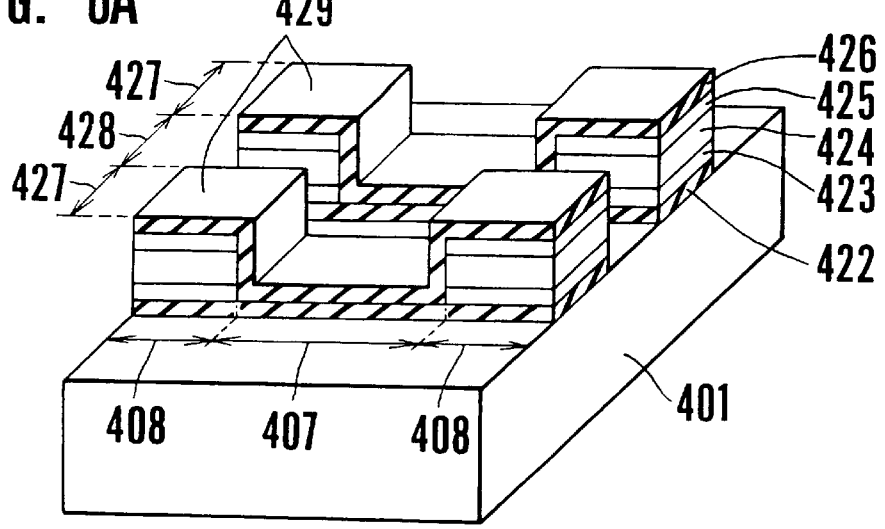
FIGS. 6A to 6C are perspective views sequentially showing steps to explain the fourth embodiment of the present invention.
Figure 6B:
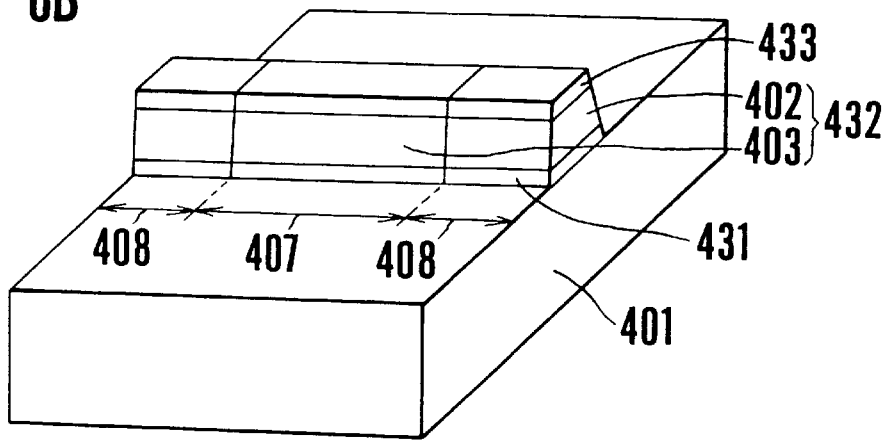
Figure 6C:
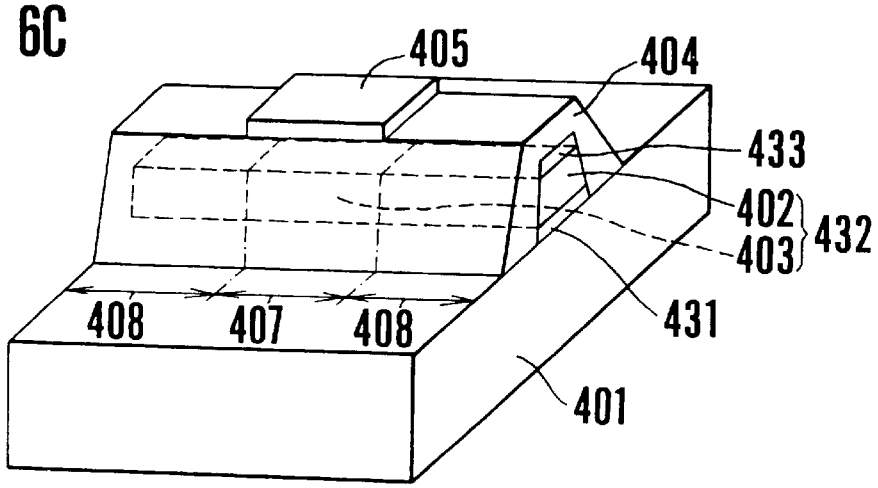

Next, the fourth embodiment of the present invention will be described. FIGS. 6A to 6C are perspective views sequentially showing the manufacturing steps of the fourth embodiment. FIG. 7 is a schematic plan view showing an optical integrated circuit manufactured in the fourth embodiment.

As shown in FIG. 7, the optical integrated circuit manufactured in this embodiment constitutes a 2×2 branch/LD amplifier gate optical switch. The perspective views of the sequential steps show states of an integrated portion of one gate portion of this optical integrated circuit and branch and multiplex waveguides near the gate portion.

To manufacture this optical integrated circuit, a pair of striped masks 429 are formed on an n-InP substrate 401, as shown in FIG. 6A. The masks are identical to those shown in FIG. 3E in the first embodiment, and a manufacturing method thereof will be omitted (reference numerals having the same two lower digit positions as those of parts in the first embodiment denote the same parts in FIGS. 6A to 6C and FIG. 7). A gate portion 407 and multiplex and branch waveguide portions 408 are arranged in place of the active guiding region 107 and the passive guiding regions in FIG. 3E to obtain a structure in FIG. 6A.

Upon forming masks, an n-InP buffer layer 431, an i-InGaAsP guiding layer 432, and a p-InP cladding layer 433 are sequentially stacked by selective MOVPE crystal growth. Epitaxial growth conditions are the same as in the first embodiment. The i-InGaAsP guiding layer 432, therefore, is converted into a 1.15-μm composition i-InGaAsP passive guiding layer 402 for each multiplex/branch waveguide portion 408, and into a 1.3-μm composition i-InGaAsP active guiding layer 403 for the gate portion 407.

The pair of striped masks 429 are removed (FIG. 6B), and a selective MOVPE crystal growth mask (not shown) consisting of an SiO$_2$ film is formed again. As shown in FIG. 6C, a p-InP burying layer 404 and a p-InGaAs cap layer 405 are grown by selective MOVPE crystal growth. Thereafter, the p-InGaAs cap layer 405 except for that on the 1.3-μm composition i-InGaAsP active guiding layer 403 is removed by wet etching. The thickness of the p-InP burying layer 404 is 1.5 μm, and that of the p-InGaAs cap layer 405 is 0.2 μm.

The gate portion 407 has a structure in which the n-InP buffer layer 431, the 1.3-μm composition i-InGaAsP active guiding layer 403, the p-InP cladding layer 433, the p-InP burying layer 404, and the p-InGaAs cap layer 405 are sequentially stacked on the n-InP substrate 401. The multiplex/branch waveguide portion 408 has a structure in which the n-InP buffer layer 431, the 1.15-$\mu$m i-InGaAsP passive guiding layer 402, the p-InP cladding layer 433, and the p-InP burying layer 404 are sequentially stacked on the n-InP substrate 401.

In this manner, the gate portion 407 having, as a gate, an optical amplifier consisting of the 1.3-$\mu$m wavelength i-InGaAsP active guiding layer 403, and the multiplex/branch waveguide portion 408 consisting of the 1.15-$\mu$m wavelength composition i-InGaAsP passive guiding layer 402 are integrated on the single substrate. In this structure, the 1.3-$\mu$m composition i-InGaAsP active guiding layer 403 and the 1.15-$\mu$m composition i-InGaAsP passive guiding layer 402 are continuously formed in the waveguide direction.

Modifications

The preferred embodiments of the present invention have been described. The present invention is not limited to these embodiments, and proper changes are deemed to lie within the sprint and scope of the patent claims. For example, although mask processing is performed by wet etching in the above embodiments, it may be performed by dry etching. InGaAsP is used as the material of a semiconductor guiding layer, but the material is not limited to this. Another material such as InGaAlAsP may be used. Further, the guiding layer may be formed into not a single semiconductor layer but an MQW structure.

Moreover, an Ar laser beam is used as irradiation light during selective MOVPE crystal growth in the second and third embodiments. Alternately, light from another light source may be used, provided that the light has a wavelength which the substrate can absorb. In the second and third embodiments, the reflection preventing film is used as a selective MOVPE crystal growth mask. The mask, however, does not always consist of the reflection preventing film, and the selective MOVPE crystal growth mask in the passive guiding region 208 or 308 and that in the active guiding region 207 or 307 have simply different reflectances. In the second embodiment, five films consisting of $SiO_2$ and $Al_2O_3$ are used as a semi-reflecting film, but the materials and the number of films are not limited to them. For example, $SiO_2$ and a-Si films may be used. Similarly, in the third embodiment, $SiO_2$ is used as a mask formation material, but another material such as SiN or SiON may be used instead of $SiO_2$.

As has been described above, according to the present invention, in the method of manufacturing a compound semiconductor integrated circuit, portions having different substrate temperatures are formed on the surface of a semiconductor substrate subjected to selective epitaxial growth. In this state, epitaxial growth is performed by vapor phase growth. With this procedure, semiconductor layers on which a difference between lattice constants is small, and a difference between wavelength compositions is large can be simultaneously grown. According to the present invention, therefore, high-quality semiconductor layers having different wavelength compositions can be formed by a smaller number of steps, and a compound semiconductor integrated circuit such as an optical integrated circuit can be manufactured with a high reliability and a high yield.

What we claimed is:

1. A method of manufacturing a compound semiconductor integrated circuit including a portion at which compound semiconductor layers having different compositions from each other are continuously formed on a semiconductor substrate in a lateral direction, comprising the steps of: keeping a substrate surface subjected to epitaxial growth at partially different temperatures; performing selective epitaxial growth by vapor phase growth in a state to form said compound semiconductor layers having different compositions from each other; and creating surface structures by lithography for localizing heating and cooling during said epitaxial growth of said semiconductor layers.

2. A method according to claim 1, further comprising the step of forming metal films adjacent to at least part of said substrate surface subjected to selective epitaxial growth to set said substrate surface subjected to epitaxial growth to partially different temperatures in accordance with a difference between film thicknesses of said metal films or presence of said metal films.

3. A method according to claim 2, further comprising the step of forming striped masks having said metal films formed partially on both sides of a region subjected to selective epitaxial growth so as to sandwich said region.

4. A method according to claim 1, further comprising the step of forming electromagnetic wave absorbers adjacent to at least part of said substrate surface subjected to selective epitaxial growth, and irradiating electromagnetic waves on said substrate surface to set said substrate surface subjected to epitaxial growth to partially different temperatures in accordance to a difference between electromagnetic wave absorbing abilities of said electromagnetic wave absorbers or presence of said electromagnetic wave absorbers.

5. A method according to claim 4, further comprising the step of forming striped masks consisting of said electromagnetic wave absorbers with partially high electromagnetic wave absorbing abilities on both sides of a region subjected to selective epitaxial growth so as to sandwich said region.

6. A method according to claim 1, further comprising the step of forming electromagnetic wave reflectors adjacent to at least part of said substrate surface subjected to selective epitaxial growth, and irradiating electromagnetic waves on said substrate surface to set said substrate surface subjected to epitaxial growth to partially different temperatures in accordance to a difference between electromagnetic wave reflecting abilities of said electromagnetic wave reflectors or presence of said electromagnetic wave reflectors.

7. A method according to claim 6, further comprising the step of forming striped masks consisting of said electromagnetic wave reflectors with partially high electromagnetic wave reflecting abilities on both sides of a region subjected to selective epitaxial growth so as to sandwich said region.

* * * * *